(12) United States Patent
Matsuda

(10) Patent No.: US 6,384,459 B1
(45) Date of Patent: May 7, 2002

(54) SEMICONDUCTOR DEVICE AND METHOD FOR PRODUCING THE SAME

(75) Inventor: Kenichi Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/442,548

(22) Filed: Nov. 18, 1999

(30) Foreign Application Priority Data

Nov. 19, 1998 (JP) ............................................. 10-330065

(51) Int. Cl.[7] .......................................... H01L 31/0232
(52) U.S. Cl. ....................... 257/435; 257/431; 257/452; 257/457; 257/458
(58) Field of Search ................................. 257/435, 431, 257/448, 452, 457, 458

(56) References Cited

U.S. PATENT DOCUMENTS

| 5,040,039 A | * | 8/1991 | Hattori et al. ................. 357/30 |
| 5,288,656 A | * | 2/1994 | Kusaka et al. ................. 437/53 |
| 5,345,075 A | | 9/1994 | Tonai et al. |
| 5,504,355 A | * | 4/1996 | Hatano ........................ 257/255 |
| 5,736,756 A | * | 4/1998 | Wakayama et al. ......... 257/223 |
| 5,773,848 A | * | 6/1998 | Wu et al. ..................... 257/72 |
| 5,773,859 A | * | 6/1998 | Ueno ........................... 257/294 |

FOREIGN PATENT DOCUMENTS

| JP | 3276769 | 12/1991 |

* cited by examiner

Primary Examiner—Eddie Lee
Assistant Examiner—N. Drew Richards
(74) Attorney, Agent, or Firm—Snell & Wilmer, LLP

(57) ABSTRACT

A photo-detecting device includes: a semiconductor substrate; a multilayer structure formed on the semiconductor substrate; an island-like photo-detecting region formed in at least a portion of the multilayer structure, the island-like photo-detecting region having a central portion; and a light-shielding mask formed on the semiconductor substrate so as to shield from light a portion of the island-like photo-detecting region at least excluding the central portion. The light-shielding mask comprises an upper metal film and a lower metal film, and the upper metal film and the lower metal film are at least partially isolated by an insulative film, the upper metal film and the lower metal film having different patterns.

11 Claims, 9 Drawing Sheets

FIG. 1A-(a)
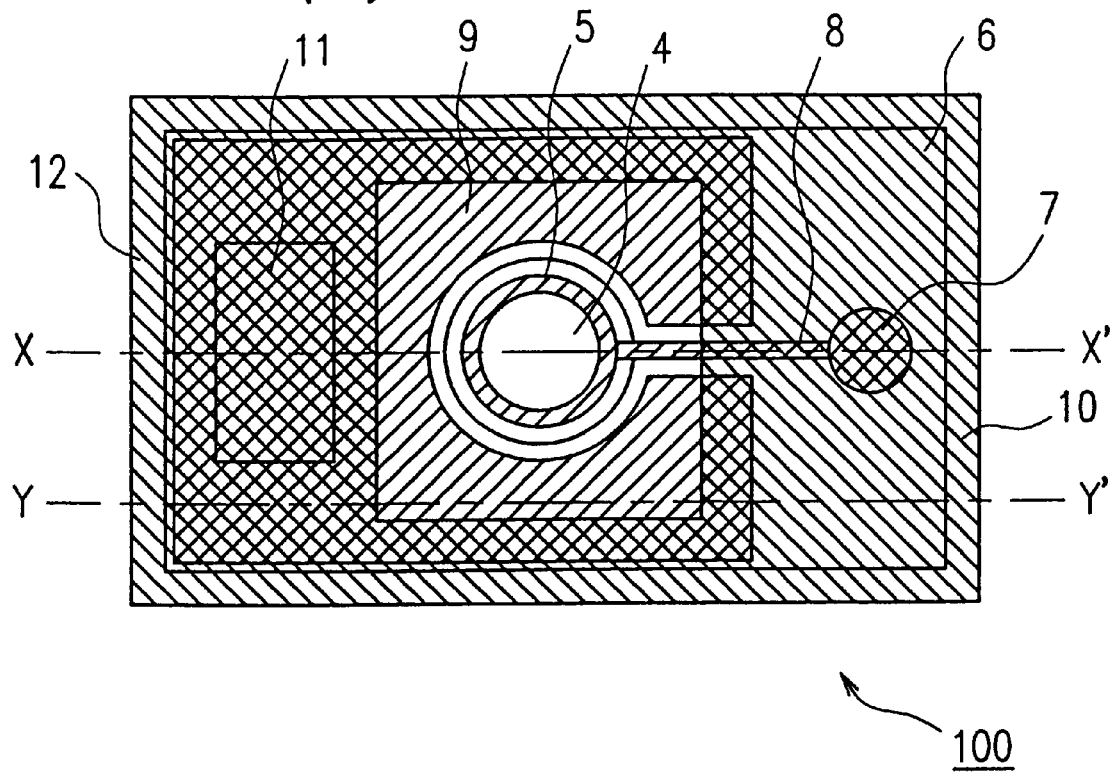
FIG. 1A-(b)
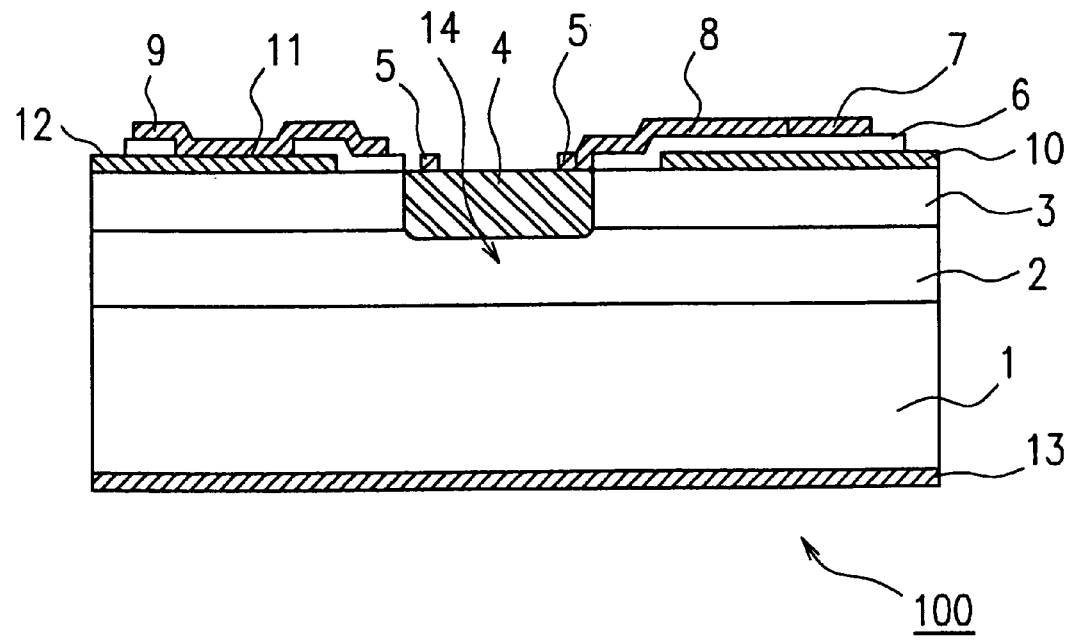

FIG.1C-(a)
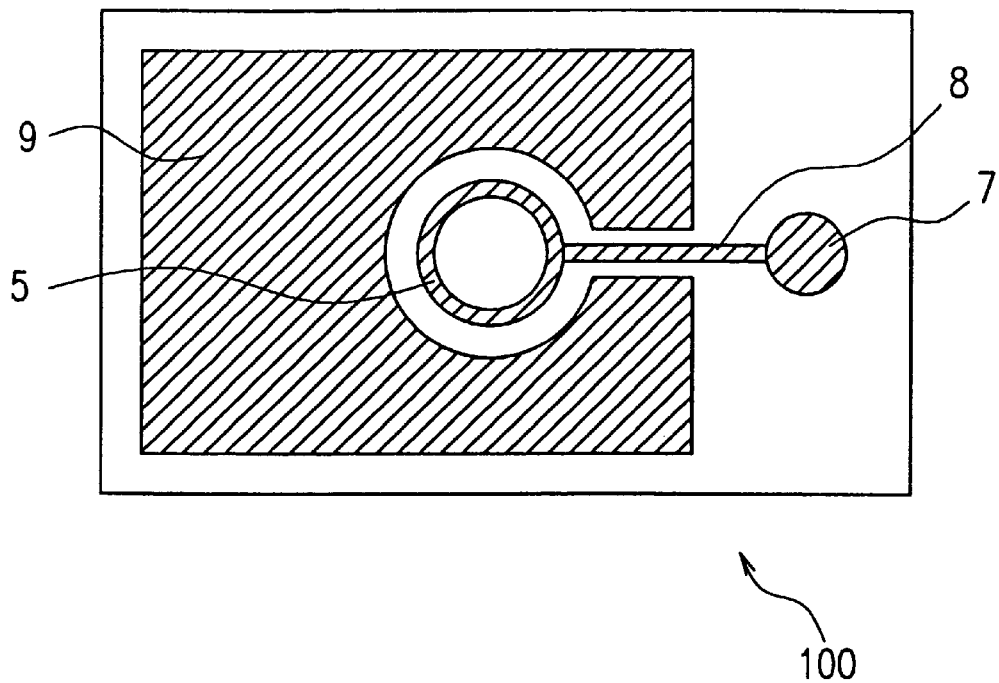
FIG.1C-(b)
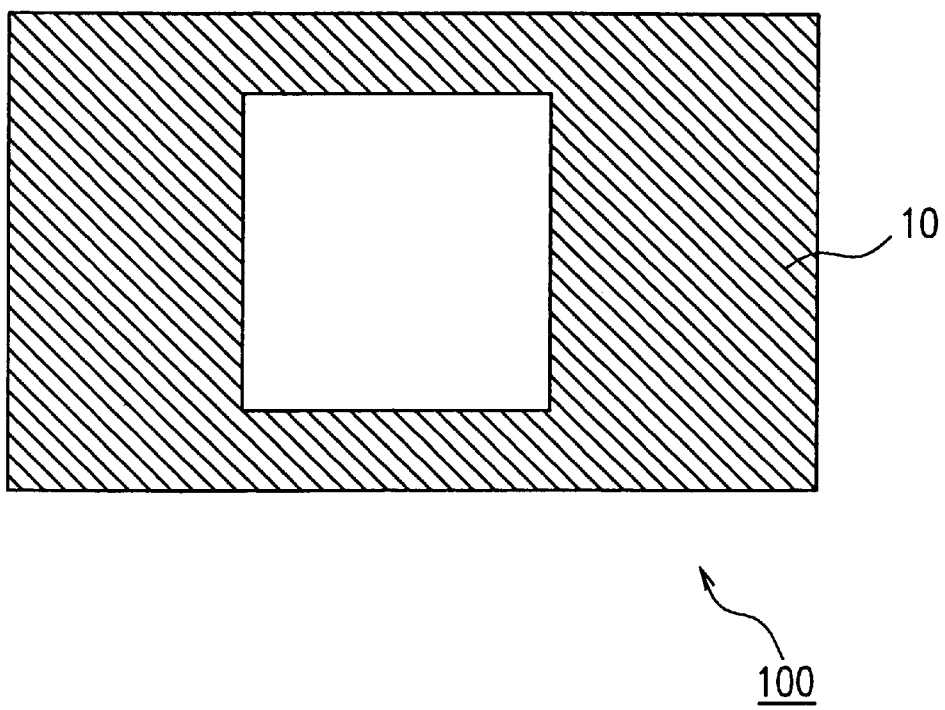

SEMICONDUCTOR DEVICE AND METHOD FOR PRODUCING THE SAME

BACKGROUND OF THE INVENTION

1. Field of the Invention

The present invention relates to a photo-detecting device. In particular, the present invention relates to a photo-detecting device which provides fast photo-sensitive response, with a reduced photocurrent component (tail current) which has very slow response as compared to that of the majority of the photocurrent; and a method for producing the same.

2. Description of the related Art

One class of photo-detecting devices having fast photo-sensitive response which are currently in wide use are so-called "pin photodiodes". Pin photodiodes can be further classified depending on the type of material used as semiconductor material, i.e., "silicon pin photodiodes", which are based on silicon, and "compound semiconductor pin photodiodes", which are based on compound semiconductor materials.

In general, a pin photodiode can be produced in the following manner.

First, a low concentration n-type semiconductor layer is allowed to grow its crystal on a high concentration n-type semiconductor substrate. Next, in predetermined regions which are to become island-like diffusion regions, a p-type impurity is diffused to some depth from the surface of the low concentration n-type semiconductor growth layer, thereby forming the island-like diffusion regions. Thereafter, a negative electrode is formed on the upper face of some of the islands of p-type diffusion regions, and a positive electrode is formed on the back face of the high concentration n-type semiconductor substrate. Thus, a pin photodiode is produced.

In the case of producing a compound semiconductor pin photodiode, e.g., InGaAs/InP, in particular, the low concentration n-type semiconductor growth layer may be formed in two layers. These two growth layers may include a light absorption layer which is adjacent to the semiconductor substrate, and a window layer formed on the light absorption layer, such that the window layer has a larger energy band gap than that of the light absorption layer. The size of the energy band gap can be adjusted by selecting the compound semiconductor material and appropriately changing the component ratios thereof. Next, a p-type impurity is diffused in the window layer to form island-like diffusion regions, whereby a compound semiconductor pin photodiode is produced. It should be noted that it is impossible to form such a window layer in a silicon pin photodiode structure because its energy band gap cannot be changed.

In a compound semiconductor pin photodiode having the above-described structure, regions of the light absorption layer which lie under the p-type diffusion regions function as photo-detecting portions. In the photo-detecting portions, a photocurrent is generated responsive to incident light which enters through the growth surface of the window layer.

Specifically, electron-hole pairs are generated through photoexcitation occurring in regions (photo-detecting portions) of the light absorption layer located under the p-type diffusion regions. The generated electron-hole pairs are dissociated by a potential barrier (electric field) at the p-n junction, so that the electrons migrate to the high concentration n-type semiconductor substrate and the holes migrate to the p-type diffusion regions. A photocurrent results from the migration of the electrons and the holes.

Compound semiconductor pin photodiodes which incorporate a window layer above a light absorption layer as mentioned above can provide an improved quantum efficiency because the window layer has a greater energy band gap than that of the light absorption layer so that the window layer becomes transparent with respect to the incident light, thereby preventing surface recombination of electron-hole pairs at the surface of the light absorption layer.

A photocurrent in a pin photodiode is primarily generated in the above-described manner. However, a photocurrent may also be generated in the case where light enters the window layer in regions other than the photo-detecting portions. Such a photocurrent may be generated due to the diffusion of holes, and has a response which is much slower than the photocurrent that is generated in the photo-detecting portions. This photocurrent having a very slow response is commonly referred to as a "tail current", which may present a significant problem in certain applications of the photo-detecting-device. The mechanism which generates a tail current will be described below.

The light entering regions of the window layer other those corresponding to the photo-detecting portions generate electron-hole pairs in the underlying light absorption layer. However, since no potential barrier (electric field) that is associated with a p-n junction exists in these regions, the generated electrons and holes migrate due to diffusion, rather than due to an electric field. That is, the generated electrons and holes diffuse in accordance with their respective density gradients so as to permeate the surrounding low concentration regions. Since the electrons are the majority carriers in the n layer (i.e., light absorption layer), it is presumable that the electrons immediately create a photocurrent before even reaching the n-substrate. On the other hand, only those of the holes which have reached the p-type diffusion regions through diffusion create a photocurrent, whereas the other holes will recombine with the electrons over a long period of time. Since the holes have a long lifetime within the light absorption layer, some holes may reach the p-type diffusion layer after having diffused through the light absorption layer over a long period of time. A tail current is defined as a component of the photocurrent that is attributable to the diffusive migration of such holes.

As described above, the cause for a tail current is the electron-hole pairs generated in regions other than the photo-detecting portions. Therefore, in order to reduce the tail current, it has been proposed to construct a photo-detecting device in which regions other than photo-detecting portions are covered by a light-shielding film such as a thin metal film. This technique for reducing the tail current is generally employed in the field of silicon pin photodiodes.

However, the aforementioned technique is difficult to apply to compound semiconductor pin photodiodes due to the nature of the actual production processes. Specifically, the production of a compound semiconductor pin photodiode requires highly precise micro-processing techniques because a depletion layer for a compound semiconductor material is much narrower than a depletion layer for silicon, as described below in more detail.

In a photo-detecting device, regions other than photo-detecting portions are Usually not entirely covered by a light-shielding film such as a thin metal film because such a light-shielding film (e.g., a thin metal film) would cause short-circuiting if they contact an annular electrode, wiring and/or a pad composed of a conductive material, which are formed on the surface of a photo-detecting device on which photo-detecting regions are formed. Rather, such a light-shielding film is provided so as to have a minimum interspace with each conductive element on the surface of the photo-detecting device. The interspaces, which cannot shield incident light, should be minimized in order to minimize the tail current. Specifically, such a light-shielding film is only required to be large enough so that its inner end (i.e., the end adjoining the interspace with a conductive element on the device surface) is in an overlapping relation with the outer periphery of an underlying depleted intrinsic semiconductor layer (i.e., a depletion layer), when viewed from above the light entering surface (i.e., the upper face of the substrate). In accordance with this configuration, even if light enters the depletion layer through the interspace, a very rapid response can be obtained because of the electric field applied to the depletion layer, so that no tail current is generated. Another advantage associated with the photo-detecting device structure in which the inner end of a light-shielding film is in an overlapping relation with the outer periphery of an underlying depletion layer is that no parasitic capacitance is additionally created.

In the case of a silicon pin photodiode, the depletion layer has a thickness of about 10 $\mu$m or more. The depletion layer also expands not only along the vertical direction but also along the horizontal direction over a width of about 10 $\mu$m or more in the vicinity of the photo-detecting regions. Therefore, for a silicon pin photodiode, the aforementioned interspace maybe prescribed to be about 10 $\mu$m in order to sufficiently restrain the tail current without allowing a parasitic capacitance to be additionally created.

On the other hand, in the case of a compound semiconductor pin photodiode the depletion layer has a thickness of only about 2 $\mu$m, while expanding along the horizontal direction over a width of only about 2 $\mu$m. Therefore, for a compound semiconductor pin photodiode, the aforementioned interspace must be prescribed to be about 2 $\mu$m. Thus, the interspace should be prescribed to be much smaller for a compound semiconductor pin photodiode than for a silicon pin photodiode, which will require highly precise micro-processing techniques. In addition, the micro-processing techniques for compound semiconductors are generally not as advanced as those required for silicon. For these reasons, it is very difficult to produce a compound semiconductor pin photodiode such that the inner end of a light-shielding film is in an overlapping relation with the outer periphery of an underlying depletion layer.

Furthermore, when producing a light-shielding film adjacent to an end of a photo-detecting region, a smaller-than-prescribed interspace may be left between an annular electrode which is formed at the edge of the photo-detecting portion and the light-shielding film due to insufficient micro-processing accuracy. In such cases, a parasitic capacitance may be created between the light-shielding film and the annular electrode. In extreme cases, the light-shielding film may be short-circuited with the annular electrode.

As described above, the technique of covering regions other than photo-detecting portions with a light-shielding film cannot be easily applied to compound semiconductor pin photodiodes. However, Japanese Laid-Open Publication No. 3-276769 discloses one such attempt (hereinafter referred to as "Conventional Example"). FIG. 6A is a plan view of a compound semiconductor pin photodiode (photo-detecting device) 600 of Conventional Example. FIG. 6B is a cross-sectional view taken along line X–Y in FIG. 6A.

With reference to FIGS. 6A and 6B, the structure of the compound semiconductor pin photodiode 600 of Conventional Example, and a method for producing the same will be described.

First, an n-InP buffer layer 62, an n-InGaAs light absorption layer 63, and an n-InP window layer 64 are formed on an n-InP substrate 61 in this order. After forming a diffusion region 66 in a portion of the window layer 64 by diffusing a p-type impurity therein, a semi-insulative InP capping layer 67 is allowed to grow its crystal over the upper face of the diffusion region 66 and the window layer 64. A via hole is formed in the capping layer 67, in which a p-InGaAs conductive embedded layer 68 is allowed to grow its crystal. Then, a p-InGaAs wiring layer 69 and a p-InGaAs wire bonding portion 70 are formed on the capping layer 67 through p-InGaAs crystal growth. The semi-insulative InP capping layer 67 is employed for reducing the interlayer capacitance between the wiring layer 69 and the wire bonding section 70 and the n-InP window layer 64. Thereafter, an insulative film 71 (e.g., SiN) is formed on the wiring layer 69 and the exposed capping layer 67. Finally, a thin metal film (e.g., Ti/Au) is vapor-deposited and patterned into a pad 72 on the wire bonding section 70 and a light-shielding film 73 on the insulative film 71. A positive electrode 65 is formed on the back face of the substrate 61. This completes the compound semiconductor pin photo-diode 600 of Conventional Example.

In accordance with the compound semiconductor pin photodiode 600 of Conventional Example, regions other than the photo-detecting portions 74 are basically covered by a thin metal film. As a result, the tail current of this device can be reduced to a certain extent.

In accordance with Conventional Example described above with reference to FIGS. 6A and 6B, the pad 72 and the light-shielding film 73 may be short-circuited when performing a wire bonding or flip-chip bonding step for the following reasons. In general, a pin photodiode is required to have a minimized device capacitance in order to operate at a high speed. Therefore, the pad area should be minimized as much as possible. Moreover, the interspace between the light-shielding film and the pad must be minimized in order to obtain a satisfactory light-shielding effect for reducing the tail current. However, designing a pin photodiode so as to have a small pad area and a minimized interspace between the pad and the light-shielding film invites a high possibility of short-circuiting between the pad and the light-shielding film because a deformed tip end portion of a wire, which is typically formed during the wire bonding step, may easily reach the light-shielding film. Even if a flip-chip bonding technique is employed to mount the pin photodiode, instead of wire bonding, there is a high possibility of short-circuiting between the pad and the light-shielding film due to mis-alignment between the photodiode chip and a bump on a wiring substrate.

SUMMARY OF THE INVENTION

A photo-detecting device according to the present invention includes: a semiconductor substrate; a multilayer structure formed on the semiconductor substrate; an island-like photo-detecting region formed in at least a portion of the multilayer structure, the island-like photo-detecting region having a central portion; and a light-shielding mask formed on the semiconductor substrate so as to shield from light a portion of the island-like photo-detecting region at least excluding the central portion, wherein the light-shielding mask comprises an upper metal film and a lower metal film, and the upper metal film and the lower metal film are at least partially isolated by an insulative film, the upper metal film and the lower metal film having different patterns.

In one embodiment of the invention, the upper metal film and the lower metal film each have an inner end portion located adjacent to the photo-detecting region; the inner end portion of the upper metal film is located more closely to the photo-detecting region, along a horizontal direction, than the inner end portion of the lower metal film; and the upper metal film is not provided in a further region which is located at a predetermined distance from the photo-detecting region, the further region being shielded from light by the lower metal film.

In another embodiment of the invention, the inner end portion of the upper metal film is in an overlapping relation with the photo-detecting region.

In still another embodiment of the invention, the upper metal film is electrically coupled with the lower metal film via an opening in the insulative film.

In still another embodiment of the invention, an outer end portion of the semiconductor substrate is shielded from light by the lower metal film, and the insulative film and the upper metal film are not formed at in the outer end portion of the semiconductor substrate.

Alternatively, the photo-detecting device according to the present invention includes: a semiconductor substrate; a light absorption layer and a window layer formed in this order on the semiconductor substrate; a diffusion region formed in an island-like shape in the window layer; a negative electrode formed on a portion of the diffusion region: an insulative film formed on a portion of the window layer at least excluding a central portion of the diffusion region; a pad formed on a region of the insulative film which is located at a predetermined distance from the diffusion region; wiring formed on the insulative film for electrically connecting the negative electrode with the pad; an upper metal film formed on the insulative film so as to surround the diffusion region without overlapping the wiring; and a lower metal film formed between the window layer and the insulative film, wherein the negative electrode, the pad, the wiring, and the upper metal film are formed from the same thin metal film.

In one embodiment of the invention, substantially the entire diffusion region above the semiconductor substrate at least excluding the central portion is shielded from light by at least one of the upper metal film and the lower metal film.

In another embodiment of the invention, the photo-detecting device further includes a positioning mark formed in a portion of the diffusion region above the semiconductor substrate at least excluding the central portion, the positioning mark being shielded from light by neither the upper metal film nor the lower metal film.

In still another embodiment of the invention, the photo-detecting device further includes a contact hole and a positive electrode, wherein the contact hole is located in a region where the window layer and the light absorption layer above the semiconductor substrate has been removed, and wherein the positive electrode comprises a portion of the lower electrode which is present in an exposed surface of the contact hole.

In still another embodiment of the invention, the photo-detecting device further includes a positive electrode formed on the semiconductor substrate and a back face metal film formed on a back face of the semiconductor substrate.

In still another embodiment of the invention, the photo-detecting device further includes a side face metal film formed on at least one side face of the semiconductor substrate, the light absorption layer, and the window layer.

In another aspect of the invention, there is provided a method for producing a photo-detecting device including the steps of: growing a light absorption layer and a window layer on a semiconductor substrate in this order; forming an island-like diffusion region in the window layer by diffusing an impurity therein; depositing a lower metal film on a portion of the window layer excluding the island-like diffusion region: depositing an insulative film on the window layer and the lower metal film; forming an opening over the island-like diffusion region by partially etching away the insulative film; depositing and lifting off a thin metal film so as to simultaneously form a negative electrode, a pad, wiring, and an upper metal film.

In one embodiment of the invention, the lower metal film is a lamination film comprising Cr, Pt, and Au.

Thus, the invention described herein makes possible the advantages of (1) providing a photo-detecting device structure in which the chip surface, excluding a photo-detecting portion, yet including end portions of the chip, is shielded from light, while substantially eliminating the possibility of short-circuiting between a pad and a light-shielding film during a wire bonding or flip-chip bonding step, and whose device capacitance is prevented from increasing due to the incorporation of the light-shielding film; and (2) providing a method for easily producing the aforementioned photo-detecting device with a minimum increase in the number of production steps relative to methods for producing conventional compound semiconductor pin photodiodes.

These and other advantages of the present invention will become apparent to those skilled in the art upon reading and understanding the following detailed description with reference to the accompanying figures.

BRIEF DESCRIPTION OF THE DRAWINGS

FIG. 1A includes a plan view (a), and a cross-sectional view (b) taken along line X–X' in FIG. 1A(a), of a compound semiconductor pin photodiode 100 according to Example 1 of the present invention.

FIG. 1C includes plan views (a) and (b) describing the photo-detecting device 100 according to Example 1 of the present invention, where (a) illustrates a metal layer region which is formed by using the same pattern as that used for forming an upper metal film, and (b) illustrates a region in which a lower metal film is to be formed.

DESCRIPTION OF THE PREFERRED EMBODIMENTS

Hereinafter the present invention will be described with reference to FIGS. 1A to 5, 7A and 7B. As used herein, a "horizontal direction" refers to a direction which is parallel to the surface of a given semiconductor substrate, whereas a "vertical direction" refers to a direction perpendicular to the surface of a given semiconductor substrate. An "upper face" refers to the face of a given layer on which its crystal growth occurs; accordingly, the direction of such growth will be expressed by the word "above" or "over". Conversely, a "lower face" and "below" or "under" imply the opposite face or direction, respectively, of the above.

As used herein, the term "island-like" is employed to mean that a region which is described as "island-like" composes a discrete portion of an element, the portion being geometrically isolated from the remainder of the element.

Figure 7A:
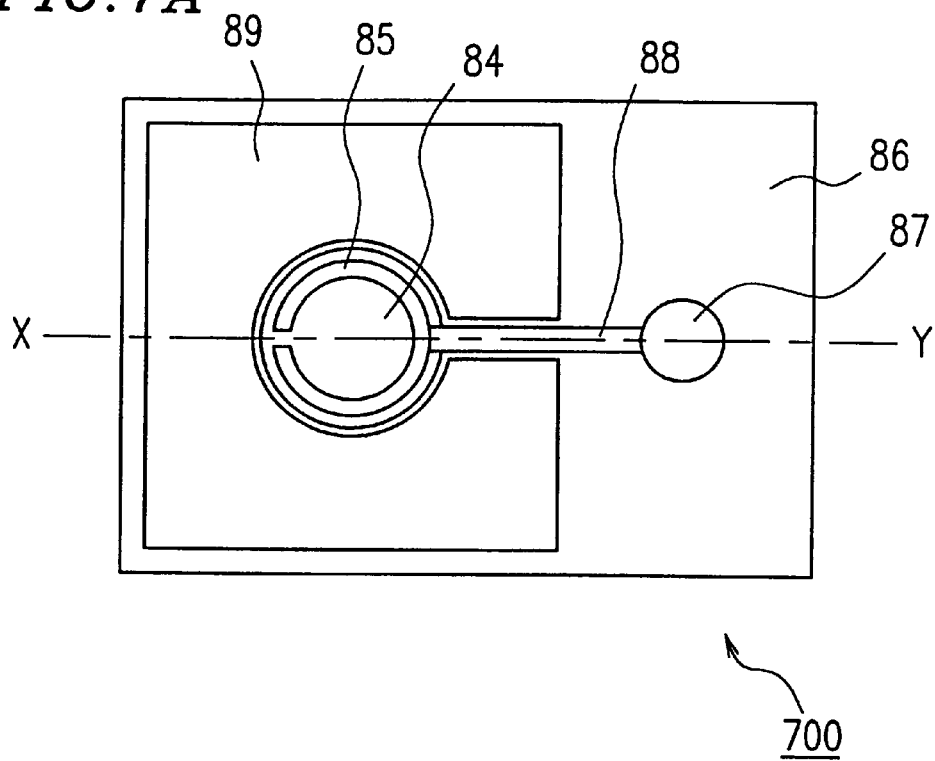
FIG. 7A is a plan view of a compound semiconductor pin photodiode 700 of Comparative Example.
Figure 7B:
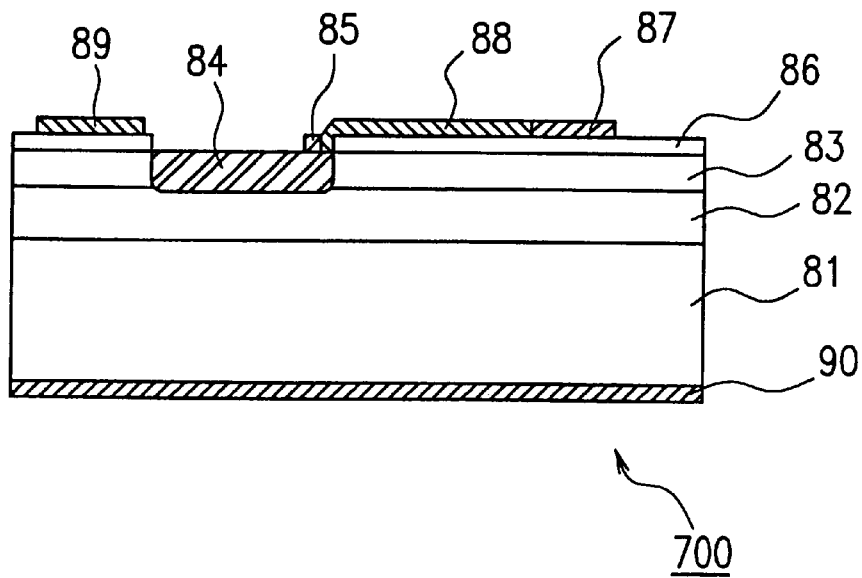
FIG. 7B is a cross-sectional view taken along line X–Y in FIG. 7A.

Japanese Laid-Open Publication No. 11-68144 discloses another attempt at employing a metal light-shielding film in an InGaAs/InP type compound semiconductor pin photodiode (hereinafter referred to as "Comparative Example"). FIG. 7A is a plan view of a compound semiconductor pin photodiode (photo-detecting device) 700 of Comparative Example. FIG. 7B is a cross-sectional view taken along line X–Y in FIG. 7A.

With reference to FIGS. 7A and 7B, the structure of the compound semiconductor pin photodiode 700 of Comparative Example will be described.

A low concentration n-InGaAs light absorption layer 82 and a low concentration n-InP window layer 83 are laminated in this order on an n-InP semiconductor substrate 81. In the window layer 83, an island-like diffusion region 84, in which a p-type impurity (e.g., Zn) is diffused, is formed. An annular negative electrode 85 is formed on the diffusion region 84. An insulative layer 86 is deposited on portions of the window layer 83 other than the diffusion region 84. A pad 87 is formed on the insulative film 86. The negative electrode 85 and the pad 87 are electrically connected via wiring 88 formed on the insulative film 86. A light-shielding film 89 is formed on the insulative film 86 so as to surround the diffusion region 84 without overlapping the wiring 88. The pad 87, wiring 88, and light-shielding film 89 are obtained by patterning a thin metal film which is simultaneously vapor-deposited. The negative electrode 85 is also formed of the same thin metal film. A positive electrode 90 is formed on the back face of the semiconductor substrate 81 through vapor deposition.

In Comparative Example described above with reference to FIGS. 7A and 7B, the wiring 88 is employed to electrically connect the negative electrode 85 on the diffusion region 84 to the pad 87, which is located away from the negative electrode 85. The photo-detecting device 700 of Comparative Example includes a minimum interspace between the wiring 88 and the light-shielding film 89, which surrounds the diffusion region 84, while permitting a large interspace between the pad 87 and the light-shielding film 89. As a result, the short-circuiting between the pad and the light-shielding film during a bonding step, which is one problem associated with Conventional Example, is overcome by Comparative Example. The structure of Comparative Example is based on the concept that the interspace between the pad 87 and the light-shielding film 89 does not need to be extremely small because the pad is located away from the actual photosensitive diffusion region.

However, in practice, a trace amount of a tail current may be generated in the interspaces which are not shielded from light (hereinafter referred to as "non-light-shielded regions") even in the structure of Comparative Example.

Specifically, under the conditions that a photosensitive diffusion region has a diameter of about 100 μm; the chip size is about 500 μm×about 300 μm; and a low concentration n-InGaAs light absorption layer has a carrier density of about $1.0 \times 10^{14}$ cm$^{-3}$ to about $5.0 \times 10^{14}$ cm$^{-3}$, a tail current which is equivalent to about 1/100 of the intended photosensitive response can be observed when light is incident on an end portion which is located at a distance of about 250 μm from the center of the photo-detecting region of the chip. A tail current of that magnitude may not be negligibly small depending on how the photo-detecting device is used. Therefore, in order to completely prevent the generation of a tail current, it is necessary to completely shield the surface of the photo-detecting device from light, excluding the photo-detecting region, but including end portions of the chip.

Furthermore, as mentioned above, a compound semiconductor pin photodiode having a metal light-shielding film requires more precise micro-processing techniques than a silicon pin photodiode having a metal light-shielding film because a depletion layer in a compound semiconductor pin photodiode is narrower than a depletion layer in a silicon pin photodiode, so that it is necessary to dispose the light-shielding film to be closer to the photo-detecting region. It is also necessary to ensure that no parasitic capacitance is generated between the light-shielding film and any annular electrodes which may be formed at an edge portion of the photo-detecting region.

EXAMPLE 1

First, the structure of a photo-detecting device 100 according to the present invention will be described with reference to FIGS. 1A to 1C.

Figure 1B:
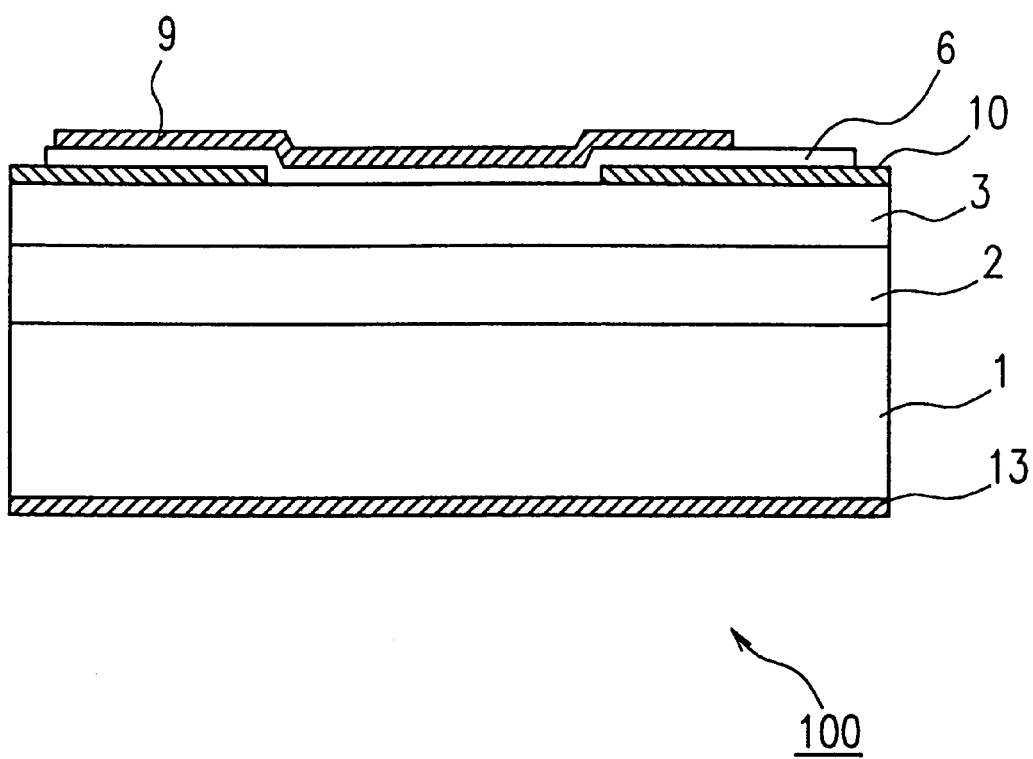
FIG. 1B is a cross-sectional view taken along line Y–Y' in FIG. 1A(a).

FIG. 1A(a) is a plan view of the photo-detecting device 100 according to Example 1 of the present invention. FIG. 1A(b) is a cross-sectional view taken along line X–X' FIG. 1A(a). FIG. 1B is a cross-sectional view taken along line Y–Y' in FIG. 1A(a).

In accordance with the photo-detecting device 100 of the present invention, a low-concentration n-InGaAs light absorption layer 2 and a low-concentration n-InP window layer 3 are laminated, in this order, on an n-InP semiconductor substrate 1. An island-like diffusion region 4, in which a p-type impurity (e.g., Zn) is diffused, is formed in the window layer 3. A region of the light absorption layer 2 underlying the diffusion region 4 defines a photo-detecting region 14. An annular negative electrode 5 is formed on the diffusion region 4. On the portions of the window layer 3 other than the diffusion region 4, a lower metal film 10, formed of a lamination film of, e.g., Cr/Pt/Au (having thicknesses of about 50 nm/about 100 nm/about 200 nm, respectively), is provided so as not to adjoin the diffusion region 4. Furthermore, an insulative film 6 is formed so as to cover the window layer 3 and the lower metal film 10. A pad 7 is formed on the insulative film 6. The negative electrode 5 and the pad 7 are electrically connected via wiring 8 formed on the insulative film 6. An upper metal film 9 is formed on the insulative film 6 so as to surround the diffusion region 4 without overlapping the wiring 8. The negative electrode 5, pad 7, wiring 8, and upper metal film 9 are simultaneously obtained by patterning a thin metal film (e.g., Ti/Pt/Au having thicknesses of about 50 nm, about 100 nm, and about 200 nm, respectively) which is vapor-deposited. The upper metal film 9 and the lower metal film 10 serve as light-shielding masks.

In FIG. 1A, the negative electrode 5, the pad 7, the wiring 8, and the upper metal film 9, which are formed from the same thin metal film, are hatched with oblique lines which descend toward the left side of FIG. 1A. Conversely, the lower metal film 10 is hatched with oblique lines which descend toward the right side of FIG. 1A. The crosshatched portions represent areas in which both the two metal layers overlap. In order to facilitate the understanding of FIG. 1A, FIG. 1C is provided where (a) only a pattern of the concurrently vapor-deposited negative electrode 5, pad 7, wiring 8, and upper metal film 9 is shown; and (b) only a pattern of the lower metal film 10 is shown.

As shown in FIGS. 1A and 1B, an opening 11 is formed in the insulative film 6 so as to correspond to a portion of the overlapped areas between the upper metal film 9 and the lower metal film 10 (i.e., a portion of the cross-hatched areas in FIG. 1A). The upper metal film 9 electrically contacts with the lower metal film 10 through the opening 11. An end portion 12, defined by the outer periphery of the upper face of the photo-detecting device 100, is shielded from light only by the lower metal film 10. That is, the insulative film 6 and the upper metal film 9 are not formed on the end portion 12.

A positive electrode 13 is formed on the-back face of the semiconductor substrate 1.

In the photo-detecting device 100 structure as described above, it is preferable that the insulative film 6 is deposited in the form of a lamination of an SiN layer (thickness: about 30 nm) and an $SiO_2$ layer (thickness: about 500 nm) because an SiN layer provides a passivation effect by reducing the dark current in the photo-detecting device, while the $SiO_2$ layer, having a lower dielectric constant than that of the SiN layer, reduces the interlayer capacitance.

Next, a method for producing the photo-detecting device 100 of the present invention will be described with reference to FIGS. 2A to 2D.

Figure 2A:
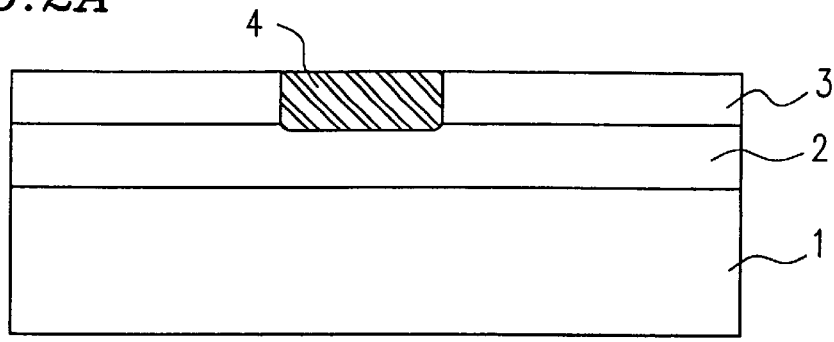
FIG. 2A is a cross-sectional view showing a step in a method for manufacturing the photo-detecting device 100 to Example 1 of the present invention.
Figure 2B:
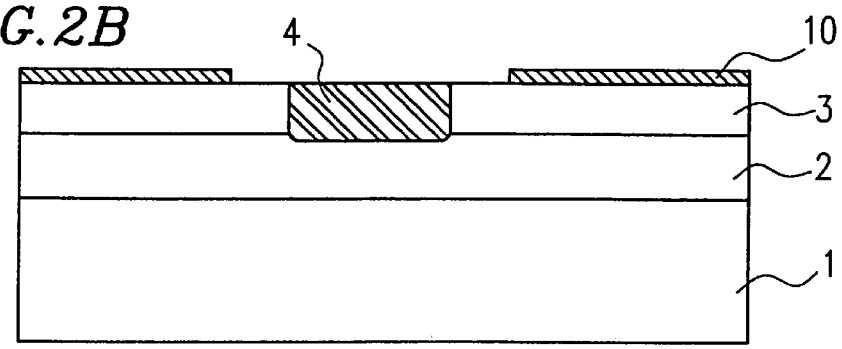
FIG. 2B is a cross-sectional view showing a step in a method for manufacturing the photo-detecting device 100 according to Example 1 of the present invention.
Figure 2C:
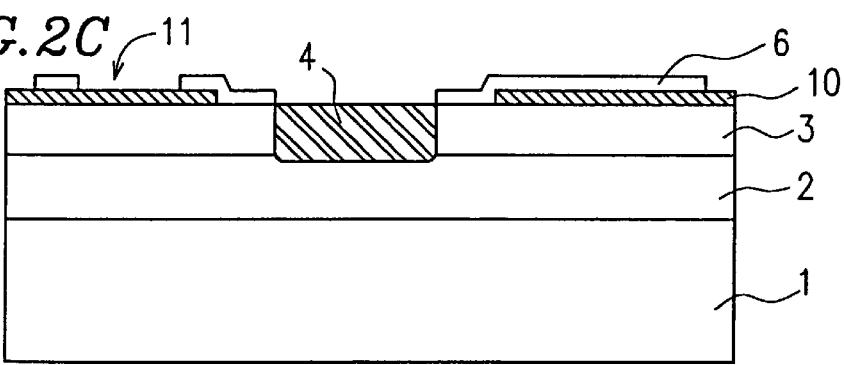
FIG. 2C is a cross-sectional view showing a step in a method for manufacturing the photo-detecting device 100 according to Example 1 of the present invention.
Figure 2D:
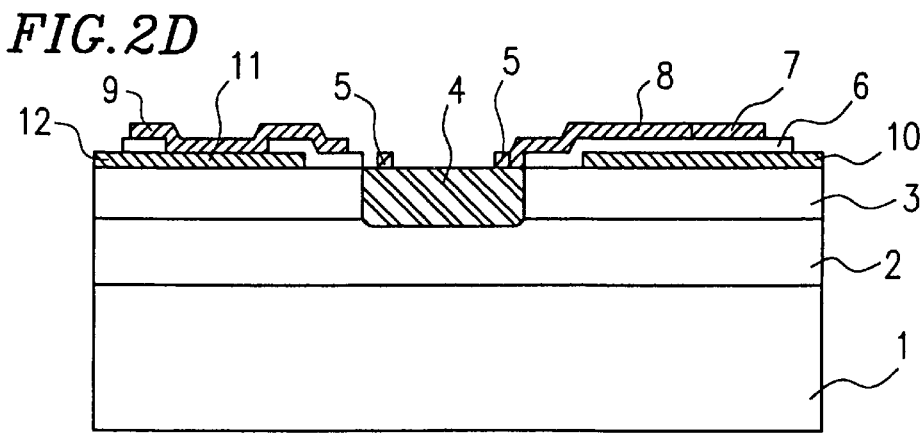
FIG. 2D is a cross-sectional view showing a step in a method for manufacturing the photo-detecting device 100 according to Example 1 of the present invention.

First, as shown in FIG. 2A, the light absorption layer 2 and the window layer 3 are grown, in this order, on the semiconductor substrate 1 by a VPE (vapor phase epitaxy) method, an MOCVD (metal-organic chemical vapor deposition) method, or the like. Thereafter, an impurity is diffused so as to form an island-like diffusion region 4 in the window layer 3. Next, as shown in FIG. 2B, a lamination film of Cr/Pt/Au is consecutively vapor-deposited on the window layer 3, and patterned by a lift-off method to form the lower metal film 10. After the insulative film 6 is deposited, the insulative film 6 is patterned through etching with an HF solution or the like as shown in FIG. 2C. This process leaves exposed an upper portion of the diffusion region 4 and forms the opening 11. Next, a lamination film of Ti/Pt/Au is consecutively vapor-deposited, and simultaneously patterned by a lift-off method into the negative electrode 5, the wiring 8, the pad 7, and the upper metal film 9, as shown in FIG. 2D. Finally, the positive electrode 13 is formed on the back face of the semiconductor substrate 1, thus producing the photo-detecting device 100 according to the present invention, as shown in FIG. 1A(b).

According to the present invention, two layers are employed as a light-shielding film or mask, i.e., the upper metal film 9 and the lower metal film 10. As described above, the upper metal film 9 is formed of the same thin metal film as the negative electrode 5 above the photo-detecting region 14, the wiring 8 (which leads out from the negative electrode 5 as shown in FIG. 1A(b)) and the pad 7 upon the insulative film 6. Therefore, the same photomask can be used to process the negative electrode 5, the wiring 8, the pad 7, and the upper metal film 9, which makes it possible to accurately determine the distance between the negative electrode 5 and the upper metal film 9, without being affected by mask alignment accuracy. Consequently, even if the actual distance between the resultant negative electrode 5 and upper metal film 9 is smaller than its designed value, this structure can prevent the occurrence of parasitic capacitance or short-circuiting therebetween.

On the other hand, an interspace may preferably be provided between the pad 7 and the upper metal film 9 in order to prevent short-circuiting therebetween during a bonding step. However, the interspace, which is provided between the pad 7 and the upper metal film 9 for the aforementioned purpose, is shielded from light by the lower metal film 10 according to the present example. This effectively prevents the generation of electron-hole pairs, and hence a tail current, in the portion of the light absorption layer 2 underlying the aforementioned interspace.

According to the present example, it is particularly important to ensure that the lower metal film 10 does not adjoin. the photo-detecting region 14 because the negative electrode 5 above the photo-detecting region 14 and the lower metal film 10 are processed by using respectively different masks.

Specifically, the distance between the negative electrode 5 and the lower metal film 10 may become extremely small depending on the mask alignment accuracy. As described above, the upper metal film 9, which is patterned from the same thin metal film as the negative electrode 5, the wiring 8, and the pad 7, serves to provide light-shielding effects in the vicinity of the photo-detecting region 14. On the other hand, the lower metal film 10 is formed by using a different photomask, and serves to provide light-shielding effects in the peripheral portion of the upper face of the photo-detecting device 100, particularly under the pad 7, and most importantly the interspace between the pad 7 and the upper metal film 9.

Although the insulative film 6 is provided between the upper metal film 9 and the lower metal film 10, there is no need to electrically insulate the upper metal film 9 from the lower metal film 10. In fact, the upper metal film 9 is in electrical contact with the lower metal film 10 via the opening 11 in the insulative film 6. In accordance with this structure, both the upper metal film 9 and the lower metal film 10 can have the same potential as that of the semiconductor substrate 1. As a result, no floating capacitance is generated between the upper metal film 9/lower metal film 10 and the semiconductor substrate 1. The capacitance component generated between the wiring 8/pad 7 and the semiconductor substrate 1 is slightly increased because now an MIM (metal-insulator-metal) capacitance component exists due to the insertion of the lower metal film 10, as opposed to an MIS (metal-insulator-semiconductor) capacitance component. However, such a slight increase in the capacitance value is negligible against the overall capacitance value of the device.

Furthermore, the end portion 12 is shielded from light only by the lower metal film 10. In other words, the insulative film 6 and the upper metal film 9 are not formed over the end portion 12.

The end portion 12 defines a so-called scribe lane which is utilized at the time when a semiconductor wafer is split into discrete chips. In general, a scribe lane which is provided at an end portion of a semiconductor substrate having semiconductor elements formed thereon serves as a margin for splitting (i.e., "scribing") the semiconductor wafer into discrete chips. As will be appreciated, scribing becomes difficult if a thick insulative or metal film exists on a scribe lane. Performing a scribing in the presence of such films may result in an irregular chip end shape, or cause the insulative or metal film to crack or peel, for example. According to the present invention, however, the insulative film 6 and the upper metal film 9 are not formed over the end portion 12, thereby overcoming such problems.

Since the lower metal film 10 is directly vapor-deposited on the window layer 3 for the purpose of light shielding, the lower metal film 10 does not need to be thick. Therefore, the lower metal film 10 existing on the end portion 12 does not present any problems in scribing.

In accordance with the method of the present invention, the photo-detecting device 100 is produced by performing the following steps in the order presented: a step of forming the diffusion region 4 through impurity diffusion: a step of forming the lower metal film 10 through vapor deposition; a step of forming the insulative film 6 through deposition; and a step of forming the upper metal film 9 through vapor deposition. The only additional step included in the method according to the present invention, as compared to a conventional method for producing compound semiconductor pin photodiode, is the step of forming the lower metal film 10 through vapor deposition. Thus, the inventive method only entails a minimum increase (i.e., one step) in the number of steps as compared to the conventional method.

The lower metal film 10 may be composed of a film of an Au/Sn alloy or a Ti/Pt/Au lamination film, for example. However, as illustrated in the present embodiment, a Cr/Pt/Au lamination film is particularly preferable for the following reason.

Since the lower metal film 10 is directly vapor-deposited on a semiconductor layer (i.e., the window layer 3 according to the present example), it is unpreferable to form the lower metal film 10 from a metal material (e.g., a film of an Au/Sn alloy) which may form an alloy with a compound semiconductor layer (e.g., InP) because it might reduce the smoothness of the interface between the lower metal film 10 and the semiconductor layer. On the other hand, Ti and Cr are representative metals which do not form an alloy with a compound semiconductor layer such as InP. However, a lower metal film 10 formed of a Ti/Pt/Au lamination film would allow the Ti component within the lower metal film 10 to be side-etched during the step of forming the opening 11 by etching the insulative film 6 with an HF solution, so that the lower metal film 10 might peel off. Accordingly, a Cr/Pt/Au lamination film is particularly preferable because a lower metal film 10 composed of a Cr/Pt/Au lamination film prevents such side-etching and hence peeling thereof.

Furthermore, the positive electrode 13 may also be composed of a Cr/Pt/Au lamination film.

Alternatively, the lower metal film 10 may also be composed of a signal layer of Cr. However again, a Cr/Pt/Au lamination film is particularly preferable because the Au layer can prevent oxidation of the Cr layer, and the Pt layer further assists in the prevention of alloying between the Au layer and the semiconductor layer, as compared to the case of composing the lower metal film 10 only of a signal layer of Cr.

The characteristics of the photo-detecting device 100 according to the present invention will now be described.

The magnitude of the tail current greatly depends on the module structure which defines how much light is incident on regions other than the photo-detecting region 14. Accordingly, the inventors measured the incident position dependency of the photosensitivity of the photo-detecting devices as one parameter determining the chip characteristics, which is shown in the graph of FIG. 3B. As would be understood from the mechanism for generating the tail current, the tail current increases as the sensitivity with which regions other than the photo-detecting region 14 responds to signal light increases.

Figure 3A:
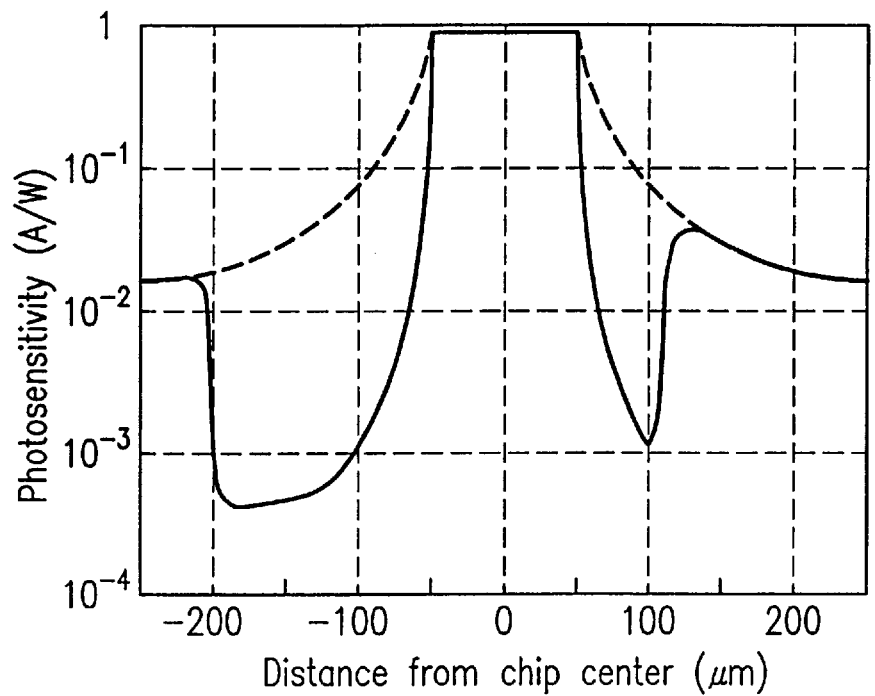
FIG. 3A is a characteristics graph illustrating the incident position dependency of the photosensitivity of a photo-detecting device according to Comparative Examples.
Figure 3B:
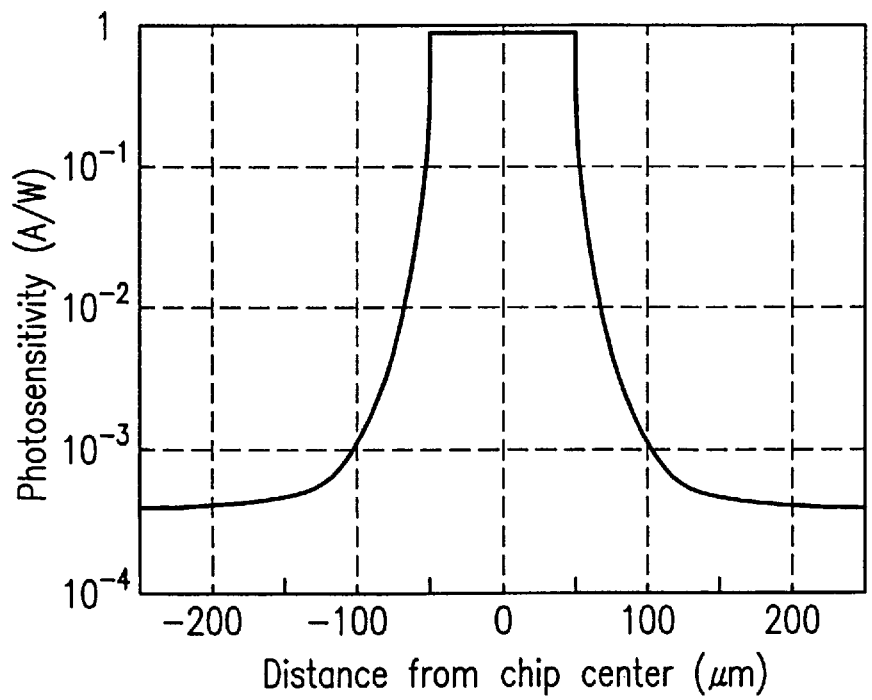
FIG. 3B is a characteristics graph illustrating the incident position dependency of the photosensitivity of the photo-detecting device 100 according to Example 1 of the present invention.

For comparison, as shown in the graph of FIG. 3A, the incident position dependency of photosensitivity was measured for two comparative photo-detecting devices, i.e., one which was produced in a manner similar to the photo-detecting device 100 of Example 1 except for lacking the lower metal film 10 (indicated by the solid line), and one which was produced in a manner similar to the photo-detecting device 100 of Example 1 except for lacking both the upper metal film 9 and the lower metal film 10, thereby completely omitting light-shielding masks (indicated by the broken line).

With reference to FIG. 3A, a range within ±50 $\mu$m from the chip center (center of the photo-detecting device) defines a photo-detecting region for each comparative photo-detecting device. Both comparative photo-detecting devices exhibited about 0.9 A/W of photosensitivity in their photo-detecting regions. In the comparative photo-detecting device which completely lacked light-shielding films (shown by the broken line in FIG. 3A), the photosensitivity in the region outside the photo-detecting region slightly decreased, resulting in a sensitivity of about 0.01A/W or more at the chip end portion. On the other hand, in the comparative photo-detecting device whose only light-shielding film was the upper metal film 9 (shown by the solid line in FIG. 3A), the photosensitivity in the region outside the photo-detecting region drastically decreased. However, the regions which were not covered by the upper metal film 9 (corresponding to the region equal to or below about −200 $\mu$m and the region equal to or above about +100 $\mu$m) showed a photosensitivity as high as that of the comparative photo-detecting device which completely lacked any light-shielding films.

On the other hand, FIG. 3B illustrates the characteristics of the photo-detecting device 100 according to the present example, which incorporates both the upper metal film 9 and the lower metal film 10 as light-shielding masks. The photo-detecting device 100 also shows about 0.9 A/W of photosensitivity in the photo-detecting region 14. However, the photosensitivity of the photo-detecting device 100 decreases to be equal to or below about 0.01 A/W immediately outside the photo-detecting device 100. According to the present invention, the upper face of the photo-detecting device 100 is substantially completely shielded from light in regions other than the photo-detecting region 14, so that the photosensitivity there is prevented from increasing again. According to the present example, the photosensitivity is reduced to be equal to or below about 0.001 A/W in regions about ±100 μm away from the chip center, indicative of a sufficient reduction in the tail current.

Figure 4:
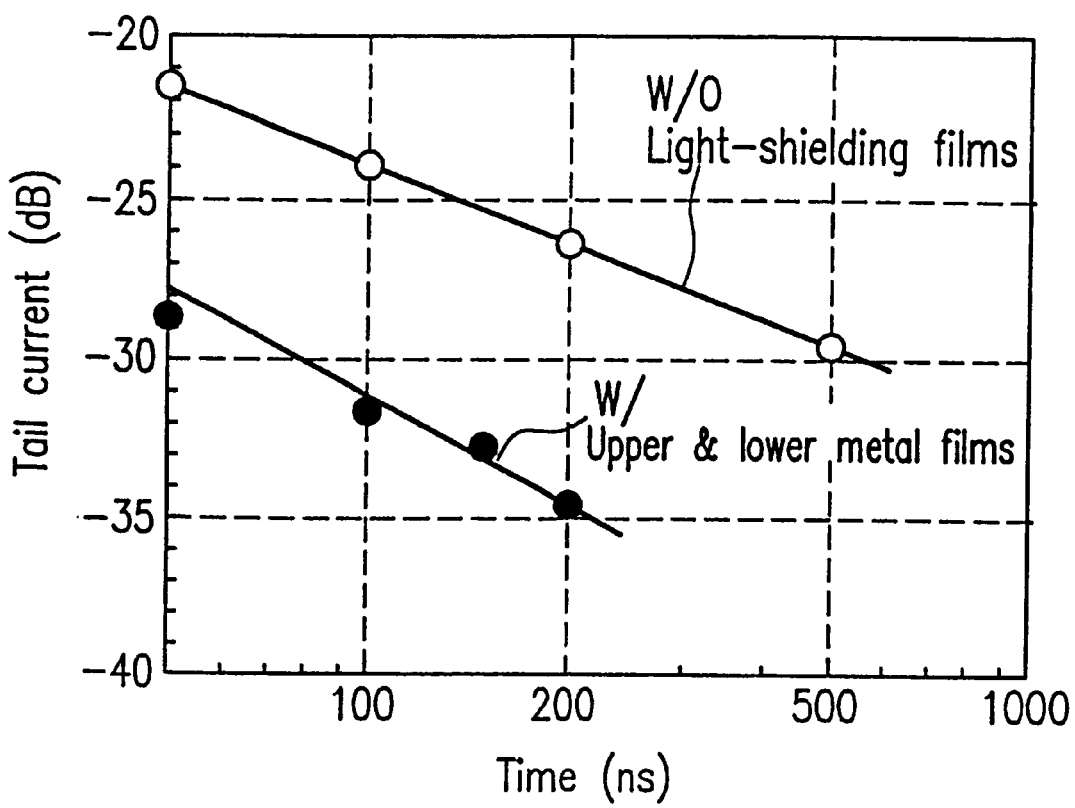
FIG. 4 is a characteristics graph illustrating the tail current of a photo-detecting device according to Comparative Example (○) and that of the photo-detecting device 100 according to Example 1 of the present invention (●).

FIG. 4 illustrates the tail current characteristics of a photo-detecting device which completely lacks light-shielding films (○), and the tail current characteristics of the photo-detecting device 100 according to the present example (incorporating both the upper metal film 9 and the lower metal film 10 as light-shielding masks)(●), after being mounted in an appropriate module structure. The measurements were taken while ensuring that the center of the incident light beam was substantially aligned with the center of the photo-detecting region. The vertical axis represents tail current values, and the horizontal axis represents the elapsed time since the signal light is turned off. The tail current values are expressed as relative values based on a current value (=1 (i.e., 0 dB)) under the condition that signal light is incident on the device.

As shown in FIG. 4, the photo-detecting device which completely lacked light-shielding films (○) exhibited a tail current value which was equal to or above about −30 dB (i.e., 1/1000) of the signal photocurrent even after about 500 ns following the termination of the signal light. On the other hand, the tail current value of the photo-detecting device 100 according to the present example (●) was already decreased to about −30 dB after about 80 ns following the termination of the signal light. Thus, the tail current is reduced in a very short time according to the present invention.

The tail current characteristics (not shown) of a conventional photo-detecting device only incorporating an upper metal film as a light-shielding film would be expected to show intermediate values between the characteristic values of the inventive photo-detecting device 100 and the conventional photo-detecting device illustrated in the graph of FIG. 4, although it some variation depending on the optical coupling accuracy of the module would occur. That is, such a conventional photo-detecting device will exhibit similar characteristics to the photo-detecting device 100 according to the present example (incorporating two light-shielding films) so long as the center of the incident light beam is accurately aligned with the center of the photo-detecting region, however, as the alignment offset between the photo-detecting region and the light-shielding film increases, the characteristics will become similar to those obtained under the complete absence of both light-shielding films.

As described above, according to the present example, there is provided a photo-detecting device in which a tail current is sufficiently reduced, as well as a method for producing such a photo-detecting device.

EXAMPLE 2

Next, a photo-detecting device 200 according to Example 2 of the present invention will be described with reference to FIGS. 5A and 5B.

Figure 5A:
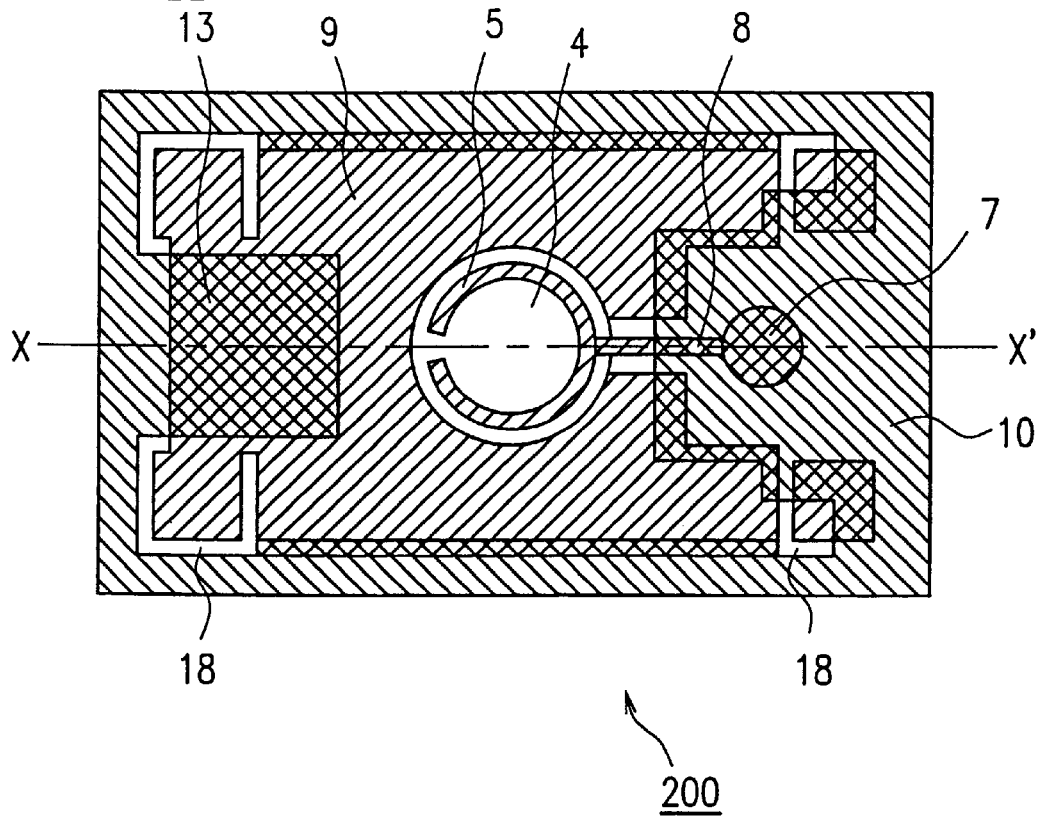
FIG. 5A is a plan view of a photo-detecting device 200 according to Example 2 of the present invention.
Figure 5B:
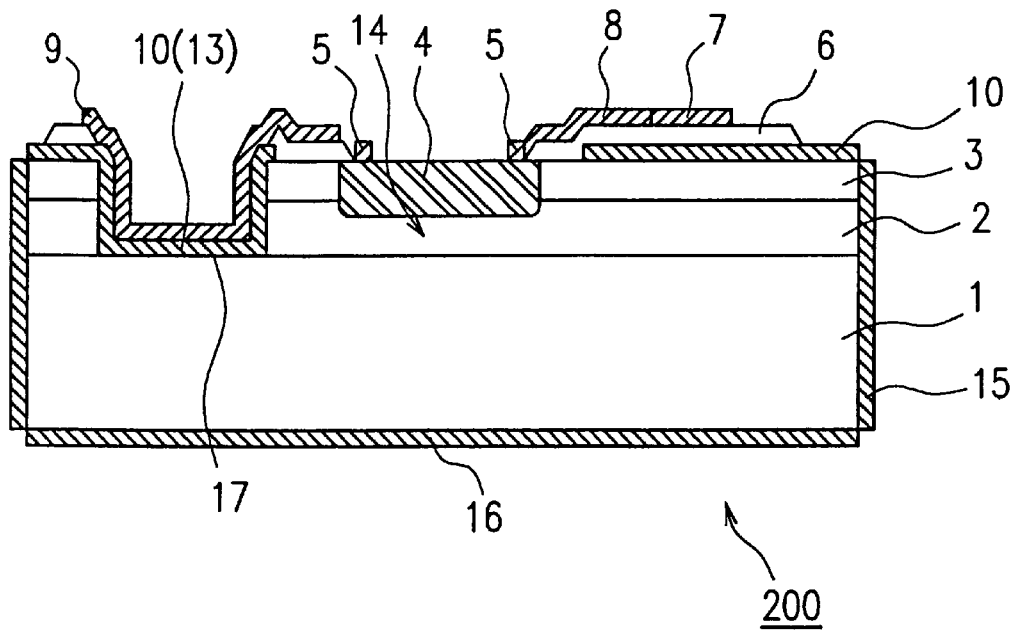
FIG. 5B is a cross-sectional view taken along line X–X' in FIG. 5A.
Figure 6A:
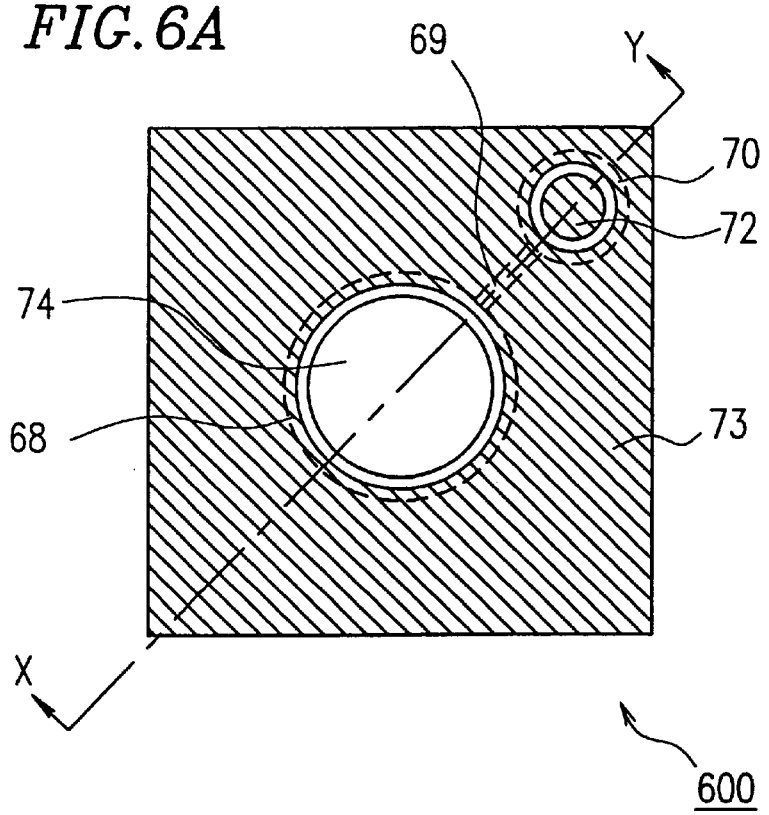
FIG. 6A is a plan view of a compound semiconductor pin photodiode 600 of Conventional Example.
Figure 6B:
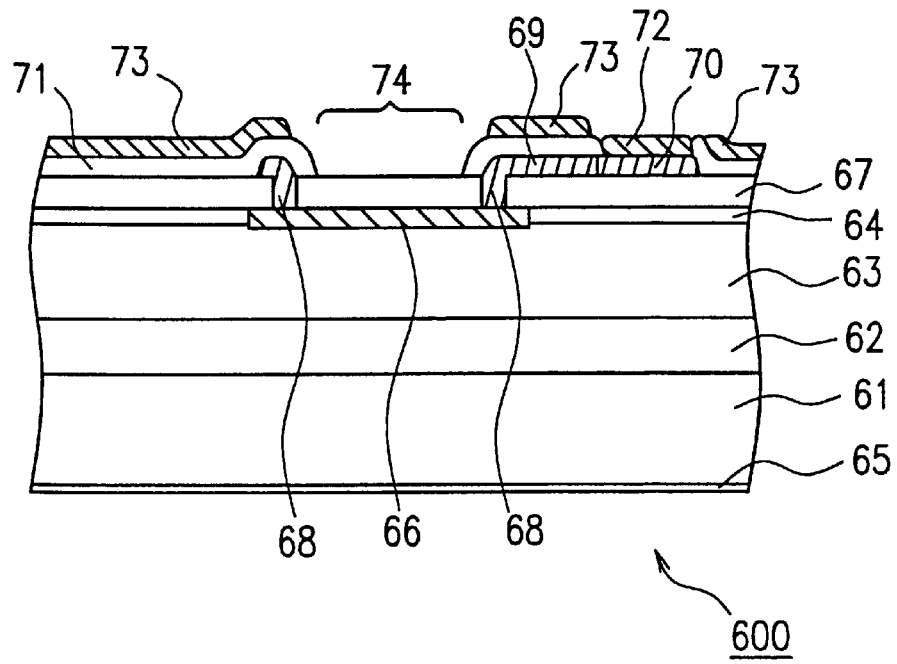
FIG. 6B is a cross-sectional view taken along line X–Y in FIG. 6A.

FIG. 5A is a plan view of the photo-detecting device 200 according to Example 2 of the present invention. FIG. 5B is a cross-sectional view taken along line X–X' in FIG. 5A. Those constituent elements which have already been discussed in Example 1 are denoted by like numerals.

First, the structure of the photo-detecting device 200 will be described with reference to FIGS. 5A and 5B.

In accordance with the photo-detecting device 200 of the present invention, a low-concentration n-InGaAs light absorption layer 2 and a low-concentration n-InP window layer 3 are laminated, in this order, on an n-InP semiconductor substrate 1. An island-like diffusion region 4, in which a p-type impurity (e.g., Zn) is diffused, is formed in the window layer 3. A region of the light absorption layer 2 underlying the diffusion region 4 defines a photo-detecting region 14. An annular negative electrode 5 is formed on the diffusion region 4. On the portions of the window layer 3 other than the diffusion region 4, a lower metal film 10, formed of a lamination film of, e.g., Cr/Pt/Au (having thicknesses of about 50 nm, about 100 nm, and about 200 nm, respectively), is provided so as not to adjoin the diffusion region 4. Furthermore, an insulative film 6 is formed so as to cover the window layer 3 and the lower metal film 10. A pad 7 is formed on the insulative film 6. The negative electrode 5 and the pad 7 are electrically connected via wiring 8 formed on the insulative film 6. An upper metal film 9 is formed on the insulative film 6 so as to surround the diffusion region 4 without overlapping the wiring 8. The negative electrode 5, pad 7, wiring 8, and upper metal film 9 are obtained by patterning a thin metal film (e.g., Ti/Pt/Au having thicknesses of about 50 nm, about 100 nm, and about 200 nm, respectively) which is simultaneously vapor-deposited. The upper metal film 9 and the lower metal film 10 serve as light-shielding masks. Thus, the photo-detecting device 200 shares the same fundamental structure with the photo-detecting device 100 according to Example 1.

In FIG. 5A, the negative electrode 5, the pad 7, the wiring 8, and the upper metal film 9, which are formed from the same thin metal film, are hatched with oblique lines which descend toward the left side of the figure. On the other hand, the lower metal film 10 is hatched with oblique lines which descend toward the right side of the figure. The cross-hatched portions represent areas in which both the two metal layers overlap.

According to the present example, as shown in FIG. 5A, positioning marks 18, which are not shielded from light by either the upper metal film 9 or the lower metal film 10, are formed in the four corners of the photo-detecting device 200 (or, more precisely, the window layer 3). As shown in FIG. 5B, a contact hole 17 is formed where the window layer 3 and the light absorption layer 2 are removed. A portion of the upper metal film 9 and a portion of the lower metal film 10 extend into the contact hole 17. The portion of the lower metal film 10 formed in the contact hole 17 serves as a positive electrode 13. Furthermore, a back face metal film 16 is vapor-deposited on the back face of the semiconductor substrate 1, and side face metal films 15 are vapor-deposited on the side faces of the photo-detecting device 200.

Next, a method for producing the photo-detecting device 200 of the present invention will be described.

First, in a manner similar to Example 1, the light absorption layer 2 and the window layer 3 are grown, in this order, on the semiconductor substrate 1 by a VPE method, an MOCVD method, or the like. Thereafter, an impurity is diffused so as to form an island-like diffusion region 4 in the window layer 3. Next, the window layer 3 and the light absorption layer 2 are partially etched away so as to form the contact hole 17. Then, the lower metal film 10, the insulative film 6, the negative electrode 5, the wiring 8, the pad 7, and the upper metal film 9 are formed through vapor deposition. Furthermore, the back face metal film 16 and the side face metal films 15 are vapor-deposited. One method for simultaneously forming the back face metal film 16 and the side face metal films 15 may be to adhere the upper face of the substrate to an adhesive sheet, scribe the substrate from the back face in this state, expand the adhesive sheet so as to produce interspaces between discrete chips, and thereafter vapor-deposit a metal on the back face as well as the side faces of the discrete chips.

The present example provides, on the basis of Example 1, a more specific photo-detecting device structure which is particularly suitable for flip-chip bonding.

In general, the photo-detecting region is usually circular as in the present example as well as in the foregoing example. However, it is difficult to utilize a circular photo-detecting region for alignment purposes. Even if positioning marks for alignment purposes are formed in regions other than the photo-detecting region, such positioning marks may not be recognizable with high contrast in the case where the entirety of the positioning marks are covered by an overlying metal film. In particular, an automatic pattern recognizer apparatus may have great difficulties in recognizing such covered positioning marks.

On the contrary, in the photo-detecting device 200 according to the present example, the positioning marks 18 which are provided in the periphery of the upper face are not shielded from light by either the upper metal film 9 or the lower metal film 10. As a result, an automatic pattern recognizer apparatus can be conveniently employed for alignment purposes when subjecting the photo-detecting device 200 to a flip-chip bonding process. The size of the positioning marks 18 is preferably minimized so as not to affect the tail current characteristics of the photo-detecting device 200 while being recognizable by an automatic recognizer apparatus.

According to the present example, virtually the entire upper face of the photo-detecting device 200, excluding the central portion of the diffusion region 4 above the semiconductor substrate 1 and the positioning marks 18, is shielded from light by the upper metal film 9 and/or the lower metal film 10. In accordance with this structure, a tail current can be effectively minimized, and accurate positioning can be achieved during a flip-chip bonding process.

Furthermore, in the case where the photo-detecting device 200 according to the present example is subjected to a flip-chip bonding process, it is necessary to form a negative electrode and a positive electrode on the upper face of the photo-detecting device 200. According to the present example, the contact hole 17 is formed in which the window layer 3 and the light absorption layer 2 are partially removed, so that a portion of the lower metal film 10 extends into the contact hole 17. As a result, the lower metal film 10 can also function as the positive electrode 13, which makes it possible to reduce the number of production steps.

In addition, in the case where the photo-detecting device 200 according to the present example is subjected to a flip-chip bonding process, there is no need to form an electrode on the back face of the semiconductor substrate 1 because the negative electrode 5 and the positive electrode 13 are formed on the upper face of the photo-detecting device 200, as described above. However, certain photo-detecting device module structures may allow stray light to enter through the back face of the semiconductor substrate, possibly causing a tail current. Accordingly, even though it may be unnecessary to form electrodes on the back face of the semiconductor substrate because the negative electrode 5 and the positive electrode 13 are formed on the upper face of the photo-detecting device 200, the back face metal film 16 may advantageously be formed on the back face of the semiconductor substrate for preventing such stray light from entering through the substrate, whereby the generation of a tail current is prevented.

Similarly, any stray light which would otherwise enter the photo-detecting device 200 through the side faces thereof can be effectively blocked by the side metal films 15 on the side faces of the photo-detecting device 200, whereby the generation of a tail current is prevented.

Although the present example illustrates a case where the back face metal film 16 and the side face metal films 15 are incorporated, they only need to be adopted as necessary. For example, either one of the back face metal film 16 or the side face metal films 15 may be incorporated, or both may be omitted.

The compound semiconductor materials to be used in Examples 1 and 2 are not limited to those described above. For example, GaAs may be used as the substrate material; GaAs may be used as the buffer layer material; GaInNAs may be used as the light absorption layer material; AlGaAs may be used as the window layer material; GaAs may be used as the capping layer material. Furthermore, the present invention is not limited to compound semiconductor pin photodiodes but can also be applied to silicon pin photodiodes or other photo-detecting devices.

Thus, the present invention provides a photo-detecting device which is capable of fast photo-sensitive response and in which the generation of a tail current is effectively controlled by the use of a light-shielding mask, such that a pad and the light-shielding film are prevented from short-circuiting during a wire bonding or flip-chip bonding step, and a photo-detecting device which is capable of greatly reducing the tail current because the surface of the photo-detecting device excluding a photo-detecting region is shielded from light all the way to end portions of the device surface, while preventing the device capacitance of the photo-detecting device from increasing due to the incorporation of the light-shielding mask.

Moreover, the present invention provides a method for easily producing a photo-detecting device in which the generation of a tail current is minimized, while entailing a minimum increase in the number of production steps as compared to conventional methods for producing photo-detecting devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photo-detecting device comprising:

a semiconductor substrate;

a multilayer structure formed on the semiconductor substrate;

an island-like photo-detecting region formed in at least a portion of the multilayer structure, the island-like photo-detecting region having a central portion; and a light-shielding mask formed on the semiconductor substrate so as to shield from light a portion of the island-like photo-detecting region at least excluding the central portion, wherein the light-shielding mask comprises an upper metal film and a lower metal film, and the upper metal film and the lower metal film are at least partially isolated by an insulative film, the upper metal film and the lower metal film having different patterns.

2. A photo-detecting device according to claim 1, wherein the upper metal film and the lower metal film mob have an inner end portion located in the vicinity of the photo-detecting region, wherein the inner end portion of the upper metal film is located more closely to the photo-detecting region, along a horizontal direction, than the inner end portion of the lower metal film, and the upper metal film is not provided in a further region which is located at a predetermined distance from The photo-detecting region, the further region being shielded from light by the lower metal film.

3. A photo-detecting device according to claim 2, wherein the inner end portion of the upper metal film is in an overlapping relation with the photo-detecting region.

4. A photo-detecting device according to claim 1, wherein the upper metal film is electrically coupled with the lower metal film via an opening in the insulative film.

5. A photo-detecting device according to claim 1, wherein an outer end portion of the semiconductor substrate is shielded from light by the lower metal film, and wherein The insulative film and the upper metal film are not formed on the outer end portion of the semiconductor substrate.

6. A photo-detecting device comprising:

a semiconductor substrate;

a light absorption layer and a window layer formed in this order on the semiconductor substrate;

a diffusion region formed in an island-like shape in the window layer;

a negative electrode formed on a portion of the diffusion region;

an insulative film formed on a portion of the window layer at least excluding a central portion of the diffusion region;

a pad formed on a region of the insulative film which is located at a predetermined distance from the diffusion region;

wiring formed on the insulative film for electrically connecting the negative electrode with the pad;

an upper metal film formed on the insulative film so as to surround the diffusion region without overlapping the wiring; and a lower metal film formed between the window layer and the insulative film, wherein the negative electrode, the pad, the wiring, and the upper metal film are formed from the same thin metal film.

7. A photo-detecting device according to claim 6, wherein substantially the entire diffusion region above the semiconductor substrate at least excluding the central portion is shielded from light by at least one of the upper metal film and the lower metal film.

8. A photo-detecting device according to claim 7, further comprising a positioning mark formed in a portion of the diffusion region above the semiconductor substrate at least excluding the central portion, the positioning mark being shielded from light by neither the upper metal film nor the lower metal film.

9. A photo-detecting device according to claim 6, further comprising a contact hole and a positive electrode, wherein the contact hole is located in a region where the window layer and the light absorption layer above the semiconductor substrate has been removed, and wherein the positive electrode comprises a portion of the lower metal film which is present in an exposed surface of the contact hole.

10. A photo-detecting device according to claim 6, further comprising a positive electrode formed on the semiconductor substrate and a back face metal film formed on a back face of the semiconductor substrate.

11. A photo-detecting device according to claim 6, further comprising a side face metal film formed on at least one side face of the semiconductor substrate, the light absorption layer, and the window layer.

* * * * *